United States Patent [19]
Xie

[11] Patent Number: 5,838,269
[45] Date of Patent: Nov. 17, 1998

[54] SYSTEM AND METHOD FOR PERFORMING AUTOMATIC GAIN CONTROL WITH GAIN SCHEDULING AND ADJUSTMENT AT ZERO CROSSINGS FOR REDUCING DISTORTION

[75] Inventor: Zheng-Yi Xie, Richardson, Tex.

[73] Assignee: Advanced Micro Devices, Inc., Sunnyvale, Calif.

[21] Appl. No.: 712,870

[22] Filed: Sep. 12, 1996

[51] Int. Cl.[6] ................................................. H03M 1/62
[52] U.S. Cl. .......................... 341/139; 341/118; 341/120
[58] Field of Search ..................................... 341/139, 118, 341/120

[56] References Cited

U.S. PATENT DOCUMENTS

| | | | |
|---|---|---|---|
| 4,091,380 | 5/1978 | Yu ............................................. | 340/347 |
| 4,611,342 | 9/1986 | Miller et al. ............................... | 381/36 |
| 4,687,760 | 8/1987 | Lee et al. ............................... | 370/110.3 |
| 4,771,472 | 9/1988 | Williams, III et al. . | |
| 4,796,287 | 1/1989 | Reesor et al. ........................... | 379/390 |
| 5,016,205 | 5/1991 | Shumway . | |
| 5,507,037 | 4/1996 | Bartkowiak et al. . | |
| 5,579,004 | 11/1996 | Linz ........................................ | 341/144 |
| 5,630,221 | 5/1997 | Birleson ............................... | 455/249.1 |
| 5,631,969 | 5/1997 | Hanson ................................... | 381/107 |
| 5,648,778 | 7/1997 | Linz et al. . | |

FOREIGN PATENT DOCUMENTS

| | | | |
|---|---|---|---|
| 0163721 | 7/1986 | Japan .................................... | 341/139 |
| 0114333 | 5/1987 | Japan .................................... | 341/139 |
| 403036808 | 2/1991 | Japan .................................... | 341/139 |
| 094028632 | 12/1994 | WIPO ................................... | 341/139 |

OTHER PUBLICATIONS

D.Morgan, A/D Conversion Using Geometric Feedback AGC, IEEE Transactions on Computers, vol. C–24 No. 11, Nov. 1975.
McGraw–Hill Encyclopedia of Science & Technology, 1982 by McGraw–Hill, Inc., pp. 881–882.

*Primary Examiner*—Jeffrey A. Gaffin
*Assistant Examiner*—Jason L. W. Kost
*Attorney, Agent, or Firm*—Conley, Rose & Tayon; E. Alan Davis; Jeffrey C. Hood

[57] ABSTRACT

A system which performs automatic gain control on received audio data. The system comprises an adjustable gain amplifier coupled to a gain control loop which is preferably a digital signal processor. The gain control loop comprises a zero-crossing detector which receives the audio output signal and generates a zero crossing output upon detection of a zero crossing. The gain control loop further comprises a gain adjustment scheduler which receives the zero crossing output and a gain adjustment signal. The gain adjustment scheduler advantageously adjusts the gain of the output signal in incremental steps near zero crossings so as to minimize distortion and the possibility of clipping of the input signal. The gain control loop further comprises a voice activity detector which detects substantial voice activity, wherein the automatic gain control system amplifies the audio input signal only during the substantial voice activity. The voice activity detector thus enables the system to suppress noise amplification during periods of silence. The amplifier has an associated gain range. The control loop further comprises a gain limiter which provides the gain adjustment signal to the gain adjustment scheduler according to the gain range of the amplifier.

12 Claims, 2 Drawing Sheets

SYSTEM AND METHOD FOR PERFORMING AUTOMATIC GAIN CONTROL WITH GAIN SCHEDULING AND ADJUSTMENT AT ZERO CROSSINGS FOR REDUCING DISTORTION

BACKGROUND OF THE INVENTION

1. Field of the Invention

The present invention relates to the field of audio range signal transceivers and, more particularly, to a combined analog/digital automatic gain control circuit in a telephone signal transceiver which includes noise control, clipping suppression and gain scheduling.

2. Description of the Relevant Art

Many electrical devices, such as an answering machine, receive an input signal wherein the input signal gain or strength can vary widely and rapidly. In such cases it is often desirable to maintain the gain of the input signal within an acceptable range in the presence of relatively large fluctuations in input signal level. This is particularly desirable if the input signal is provided to another device requiring a certain range of input signal level. Automatic gain control (AGC) circuits are commonly included in such electrical devices to maintain the gain of the input signal at a relatively constant value or within a desired dynamic range. AGC circuits operate by adjusting the amplification of the input signal in inverse proportion to the input signal strength.

A common application of AGC circuits is in telephone devices or signal transceivers, including digital cordless telephone base stations and digital telephone answering machines. In digital telephone transceivers an analog input signal, such as speech, music or dual-tone multifrequency (DTMF) signals, is converted to a digital signal by an analog-to-digital converter. A digital signal processor or other digital circuitry in the telephone device then performs operations on the digital signal. For example, the telephone answering device typically includes a vocoder which performs voice coding on the digital signal and stores the coded data. It is crucial that the input digital signal be maintained within a dynamic range which is acceptable for the telephone device. Otherwise, a loss of information occurs due to distortion (including clipping) or low signal to noise ratio (SNR). Hence, a telephone device typically employs an AGC circuit to maintain the signal within the desired dynamic range.

One important aspect of AGC circuits is their stability. The AGC circuit is required to adjust the amplification of the input signal in inverse proportion to the gain of the input signal while maintaining stability of the circuit. If the AGC adjusts the gain too frequently or in too large amounts, the gain control loop may become unstable. Hence, in designing an AGC circuit it is necessary to examine and analyze the input signal strength and to adjust the amplification relatively infrequently and in small amounts. This can be achieved by using a closed-loop feedback control system in which all the poles of the loop transfer function reside in the unit circle.

When analog-to-digital converters convert an analog input signal to a digital output signal, a phenomenon known as "clipping" may occur. Signal clipping occurs when the input signal exceeds the maximum input level of the analog-to-digital converter. Hence, the amplitude of the input signal above the analog-to-digital converter upper threshold is "clipped". This results in distortion, or unfaithful reproduction, of the input signal. As a greater amount of the amplitude of the input signal is clipped, and the longer clipping is allowed to occur, more distortion is introduced into the output signal. Hence, the possibility of clipping produces a motivation to design an AGC circuit which responds relatively quickly to adjust the gain of the input signal. This motivation is apparently in conflict with the goal of designing a stable AGC.

When the input signal strength is relatively low, the AGC circuit will amplify the signal accordingly. However, if the signal is amplified above the maximum input level of the analog-to-digital converter, then clipping may occur. To eliminate this problem, AGC circuits sometimes include circuitry to detect zero crossings of the input signal, i.e., the signal waveform changing from a positive to negative value or vice versa. The AGC then amplifies the input signal near a zero crossing to reduce the distortion and the possibility of clipping. However, an improved system and solution is sought.

Digital telephone devices comprising a DSP generally have the DSP perform the amplification. This solution is problematic in that the digital signal processor is operating on a digital signal, i.e., one which has already potentially been clipped. Hence, a lower distortion solution is desired.

Another problem associated with AGC circuits in telephone devices is the amplification of noise during periods of silence. During periods of silence, the input signal strength is very small. Under standard operation the AGC circuit detects that the signal strength has gone below an acceptable range, and the circuit increases the gain substantially to attempt to get the signal back into the desired range. As a result, noise present during the silent period, most notably the noise introduced by the telephone device, is also amplified. It may be annoying for a user to hear amplified noise during silent periods. A common example is the hiss often heard on older vintage speakerphones during periods of silence; a system and method is desired which provides improved automatic gain control.

SUMMARY OF THE INVENTION

The present invention comprises a system which performs automatic gain control on received audio data. The system comprises an amplifier with an adjustable gain which receives an audio input signal and generates an audio output signal. The amplifier also receives a gain input, wherein the amplifier selectively adjusts the gain of the audio output signal according to the gain input. A gain control loop is coupled to the amplifier. The gain control loop receives the amplified audio output signal and generates a gain output signal provided to the gain input of the amplifier to selectively adjust the gain of the amplifier. The gain control loop is preferably a digital signal processor.

The gain control loop comprises a zero-crossing detector which receives the audio output signal and generates a zero crossing output upon detection of a zero crossing.

The gain control loop further comprises a gain adjustment scheduler which receives the zero crossing output and a gain adjustment signal. The gain adjustment scheduler maintains a previous gain output signal value. The gain adjustment scheduler calculates a number of gain adjustment steps by dividing the gain adjustment signal by a gain step. For each of the number of gain adjustment steps the gain adjustment scheduler waits a gain adjustment interval then generates the gain output signal when the zero crossing output indicates an occurrence of the zero crossing, wherein the gain output signal has a value which is one gain step different than the previous gain output signal value. In this manner the present invention advantageously adjusts the gain of the output signal so as to minimize distortion and possibility of clipping of the input signal.

The gain control loop further comprises a voice activity detector which detects substantial voice activity, wherein the automatic gain control system amplifies the audio input signal only during the substantial voice activity. The voice activity detector thus enables the system to suppress noise amplification during periods of silence.

The amplifier has an associated gain range. The control loop further comprises a gain limiter which provides the gain adjustment signal to the gain adjustment scheduler according to the gain range of the amplifier.

BRIEF DESCRIPTION OF THE DRAWINGS

A better understanding of the present invention can be obtained when the following detailed description of the preferred embodiment is considered in conjunction with the following drawings, in which.

Figure 1:
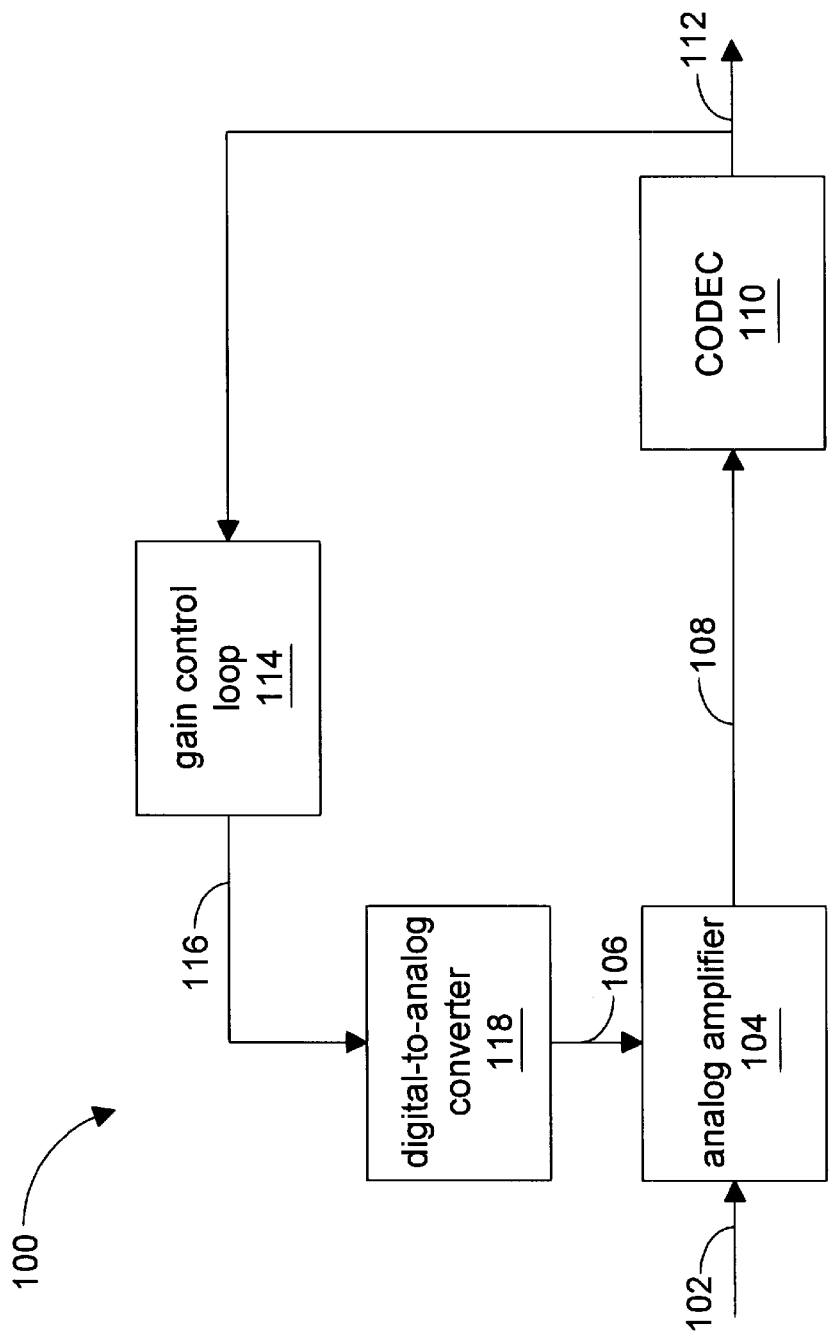
FIG. 1 is a block diagram of a system 100 for performing automatic gain control on an audio input signal according to the preferred embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Referring now to FIG. 1, a block diagram of a system or performing automatic gain control on an analog input signal 102 in the audio frequency range according to the preferred embodiment of the present invention is shown. An analog amplifier 104 receives the audio input signal 102. The amplifier 104 has an adjustable gain which is controlled by an analog gain adjustment input 106. The amplifier 104 amplifies or attenuates the input signal 102 and produces a corresponding amplified analog audio output signal 108. A CODEC (coder/decoder) 110 receives the output signal 108 and converts the analog output signal 108 into a digital audio output signal 112. An application circuit (not shown), such as a digital telephone answering machine, preferably receives the digital output signal 112 and processes the digital output signal 112 to perform a desired function.

A gain control loop 114 receives the digital output signal 112. The control loop 114 analyzes the digital output signal 112 and generates a digital gain output 116 to adjust the gain of the amplifier 104. The control loop 114 is preferably a digital signal processor programmed to perform the device functions. The control loop may also be comprised of a programmed general purpose CPU or dedicated digital or analog circuitry.

An digital-to-analog (D/A) converter 118 receives the digital gain output 116 and converts the digital gain output 116 into the analog gain input 106 to adjust the gain of the amplifier 104. The control loop 114 selectively increases the gain, decreases the gain or does not change the gain of the amplifier 104 according to the analysis of the digital output signal 112.

The preferred embodiment of the present invention advantageously combines an analog amplifier 104 and a digital gain control loop 114. By amplifying the analog input signal 102 in an analog manner the present invention advantageously minimizes clipping. That is, the analog input signal 102 is amplified, i.e., the gain is adjusted, before being converted into a digital signal by the CODEC 110. Thus if the input analog signal 102 has exceeded the dynamic range of the CODEC 110, then adjusting the gain prior to A/D conversion results in a reduced amount of the input signal (and possibly none of it) being clipped. This results in better performance than if the input signal was directly converted to a digital signal before the signal could be amplified or attenuated. This is an improvement over prior art digital gain control loops which amplify or attenuate a digital version of the input signal. The present invention also provides improved accuracy and noise control over analog solutions, as well as a reduction in overall system cost due to the reduction of the number analog components.

Figure 2:
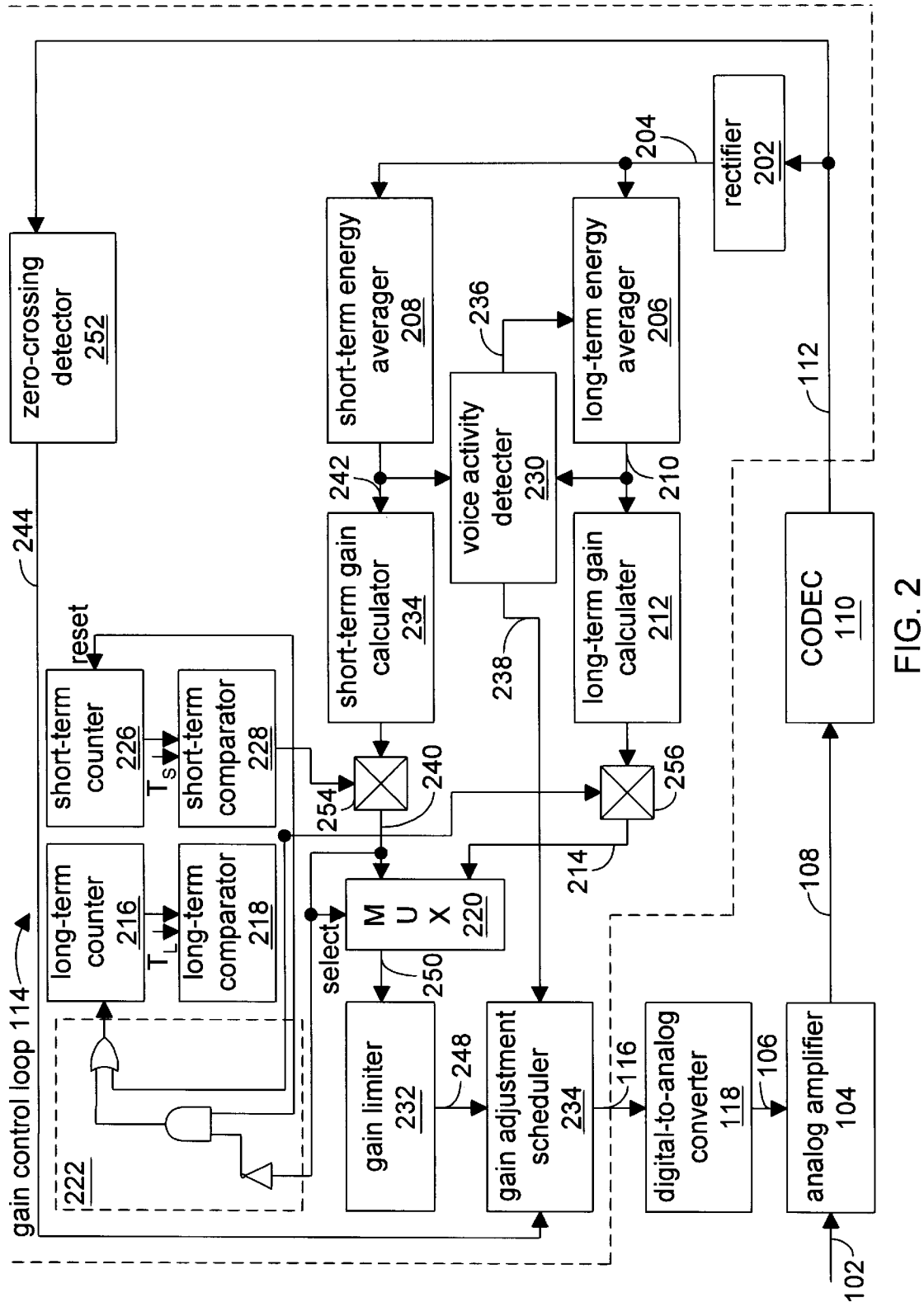
FIG. 2 is a block diagram illustrating more detailed portions of the automatic gain control system shown in FIG. 1.

Turning now to FIG. 2, a block diagram illustrating more detailed portions of the automatic gain control system 100 of FIG. 1, particularly the gain control loop 114, is shown. Elements in FIG. 2 which are similar or identical to elements in FIG. 1 have the same reference numerals for simplicity and clarity. Preferably gain control loop 114 includes a rectifier 202 which receives the digital audio output signal 112 and generates a rectified digital audio output signal 204. Gain control loop 114 also includes a long-term energy averager 206 and a short-term energy averager 208 which each receive the rectified output signal 204. By receiving a rectified version of the output signal, the energy averagers advantageously calculate energy averages with a better dynamic range than implementations which calculate energy averages by squaring the value of the signal.

The long-term energy averager 206 is preferably a normalized auto-regressive filter with a relatively long time constant. The long-term energy averager 206 estimates an average of the energy of the rectified digital output signal 204 over a relatively large number of samples, corresponding to the time constant of the filter, and generates a long-term energy average output 210. By calculating an average of the energy of the output signal 204 over a relatively large number of samples, the long-term energy averager 206 advantageously enables the gain control loop 114 to maintain the stability of the gain control system 100. Alternatively, the long-term energy averager 206 is an auto-regressive filter which calculates the long term energy average using the previous long-term energy average and a few of the most recent samples.

The long-term energy average output 210 is received by a long-term gain calculator 212. The long-term gain calculator 212 periodically generates a long-term gain adjustment signal 214 according to a long-term gain adjustment period, $T_L$. The time constant of the long-term energy averager 206 is preferably approximately equivalent to the long-term gain adjustment period $T_L$. In the preferred embodiment $T_L$ is approximately 400 samples, where the preferred sample rate is 8 kHz. A long-term counter 216 counts up from zero upon being reset. A long-term comparator 218 receives the output of the long-term counter 216 and compares the output with $T_L$. When the long-term counter 216 output equals $T_L$ the comparator 218 opens a switch 256 which passes the long-term gain adjustment signal 214 through to a multiplexer 220. The long-term comparator 218 simultaneously resets the long-term counter 216.

The long-term gain calculator 212 generates the long-term gain adjustment signal 214 to maintain the audio input signal 108 within a long-term energy average range. This predetermined range is preferably determined by the dynamic range of the CODEC 110. In the preferred embodiment the upper threshold of the long-term energy average range is 13 significant bits and the lower threshold of the long-term energy average range is 11 significant bits. These preferred values are based upon a preferred embodiment where the CODEC 110 is a 16 bit CODEC. Thus, the output dynamic range of the system 100 is preferably 18 dB. If the long-term energy average output 210 is within the long-term energy average range the long-term gain calculator 212 generates a long-term gain adjustment of zero to effect no gain adjustment. If the long-term energy average output 210 is greater than the upper long-term energy average threshold the long-term gain calculator 212 generates a long-term gain adjustment of less than zero to attenuate the input signal 102. If the long-term energy average output 210 is less than the lower long-term energy average threshold the long-term gain calculator 212 generates a long-term gain adjustment of greater than zero to amplify the input signal 102.

The short-term energy averager 208 is preferably a moving average filter with a relatively short time constant. The short-term energy averager 208 estimates an average of the energy of rectified digital output signal 204 over a relatively small number of samples, corresponding to the filter time constant, and generates a short-term energy average output 242. The following equation describes the preferred embodiment of the calculation of the short-term energy average output 242 by the moving average filter.

$$y(n)=0.125* \Sigma \times (n-i)=y(n-1)+0.125* \times (n)-0.125* \times (n-8)$$

In the above equation, y(n) is the short-term energy average output 242, x(n) is the rectified digital output signal 204, and n is a sample number. By calculating an average of the energy of the output signal 204 over a relatively small number of samples the short-term energy averager 208 advantageously enables the gain control loop 114 to respond quickly to attenuate, and thus minimize clipping of, the input signal 102.

The short-term energy average output 242 is received by a short-term gain calculator 224. The short-term gain calculator 224 periodically generates a short-term gain adjustment signal 240 according to a short-term gain adjustment period, $T_S$. The time constant of the short-term energy averager 224 is preferably approximately equivalent to the short-term gain adjustment period $T_S$. In the preferred embodiment $T_S$ is approximately eight samples, where the preferred sample rate is 8 kHz. A small value of $T_S$ effects an "emergency" response to quickly avoid clipping. A short-term counter 226 counts up from zero upon being reset. A short-term comparator 228 receives the output of the short-term counter 226 and compares the output with $T_S$. When the short-term counter 226 output equals $T_S$ the comparator 228 opens a switch 254 which passes the short-term gain adjustment signal 240 through to the multiplexer 220. The short-term comparator 228 simultaneously resets the short-term counter 226.

The short-term gain calculator 224 generates the short-term gain adjustment signal 240 to maintain the audio input signal 108 below a short-term energy average threshold. This threshold is preferably determined by the dynamic range of the CODEC 110. In the preferred embodiment the short-term energy average threshold is 15 significant bits, where the CODEC 110 is preferably a 16 bit CODEC. If the short-term energy average output 242 is below the short-term energy average threshold, the short-term gain calculator 224 generates a short-term gain adjustment signal 240 of zero to effect no gain adjustment. If the short-term energy average output 242 is greater than the short-term energy average threshold the short-term gain calculator 224 generates a short-term gain adjustment signal 240 of less than zero to attenuate the input signal 102. Preferably the short-term gain calculator 224 generates a short-term gain adjustment of −3 dB each short-term gain adjustment period, up to 6 periods, as long as the short-term energy average output 242 is greater than the short-term energy average threshold. A long-term gain adjustment period later, the long-term gain calculator 224 responds to adjust the gain to a level within the long-term energy average range.

The multiplexer 220 receives the long-term gain adjustment signal 214 and the short-term gain adjustment signal 240. The select input of the multiplexer 220 is coupled to the short-term gain adjustment signal 240. Hence, the short-term gain adjustment signal 240 is given a higher priority in that, whenever a non-zero short-term gain adjustment signal 240 is generated, the multiplexer 220 selects the short-term gain adjustment signal 240 instead of the long-term gain adjustment signal 214. Thus, the multiplexer 220 advantageously causes the gain control loop 114 to respond to clipping more quickly.

The multiplexer 220 selects either the long-term gain adjustment signal 214 or the short-term gain adjustment signal 240 and outputs a new gain adjustment signal 250.

It is noted that by employing a long-term energy averager and gain calculator in combination with a short-term energy averager and gain calculator, the present invention advantageously achieves the apparently conflicting objectives of having an automatic gain control system which is both stable and responds quickly to clipping.

Combinatorial logic 222 receives the output of the long-term comparator 218 and the output of the short-term comparator 228 and the short-term gain adjustment 240. The combinatorial logic 222 generates the reset input to the long-term counter 216 such that when the short-term gain calculator 224 generates a non-zero short-term gain adjustment 240 the long-term counter 216 is reset. Thus the combinatorial logic 222 preferably avoids generating a long-term gain adjustment immediately following a short-term gain adjustment.

A voice activity detector 230 receives the long-term energy average output 210 and the short-term energy average output 242. The voice activity detector 230 generates a silence present output 236 upon detection of a substantial absence of voice activity. In detecting a substantial absence of voice activity, the voice activity detector 230 detects the ratio of the short-term energy average output 242 and the long-term energy average output 210, and determines if this ratio is less than a silence energy average threshold for a silence time threshold. The silence energy average threshold is preferably approximately 30 dB. The silence time threshold is preferably approximately 400 samples at a preferred sample rate of 8 kHz. The value of the silence energy average threshold is chosen as a function of the operating signal to noise ratio of the system 100. The silence energy average threshold is preferably chosen to be a few dB below the signal to noise ratio so that low energy speech on the audio input signal 102 is not mistaken as noise, i.e., as silence.

The long-term energy averager 206 receives the silence present output 236. The long-term energy averager 206 advantageously pauses operation during the absence of voice activity. That is, the long-term energy averager 206 does not include samples of the rectified output signal 204 in calculating the long-term energy average output 210 in the absence of voice activity. Thus, advantageously the voice activity detector causes the long-term energy averager 206 to more accurately estimate the average energy of the rectified output signal 204 since the silence does not affect the long-term energy average. If the long-term energy average output 210 included the silence, the long-term energy average output 210 would be inordinately small, thus the long-term gain calculator 212 would greatly increase the gain of the amplifier 104. This would potentially cause instability in the system 100. Thus, advantageously the voice activity detector increases the stability of the system 100. A more accurate long-term energy average output also causes the voice activity detector to advantageously more accurately detect the presence of silence.

The analog amplifier 104 has a limited gain range. In the preferred embodiment the upper limit of the gain range is 30 dB and the lower limit is −30 dB. The gain adjustment 250 is received by a gain limiter 232. The gain limiter 232 insures that the gain control loop 114 adjusts the amplifier gain only within the limited gain range of the amplifier 104. The gain limiter 232 maintains the old digital gain output, i.e., the previous value of the digital gain output 116. Each time a new gain adjustment 250 is generated, the gain limiter 232 adds the new gain adjustment 250 to the old digital gain output to produce a new gain level. The gain limiter 232 then compares the new gain level with the upper and lower limits of the gain range. If the new gain level is greater than the upper limit of the gain range the gain limiter 232 makes the new gain level to be the upper limit of the gain range and makes the gain-limited new gain adjustment 248 to be the upper limit of the gain range minus the old digital gain output. If the new gain level is less than the lower limit of the gain range the gain limiter 232 makes the new gain level to be the lower limit of the gain range and makes the gain-limited new gain adjustment 248 to be the lower limit of the gain range minus the old digital gain output. It is noted that the gain-limited new gain adjustment is a signed value. The gain limited 232 then makes the old digital gain output to be the new gain level. The gain limiter 232 then outputs the gain-limited new gain adjustment 248.

The following pseudo-code illustrates the operation of the gain limiter.

```
new gain level =
old digital gain output + new gain adjustment
if (new gain level > upper limit) {
new gain level = upper limit
gain limited new gain adjustment =
upper limit - old digital gain output
} else if (new gain level < lower limit) {
new gain level = lower limit
gain limited new gain adjustment =
lower limit - old digital gain output
}
old digital gain output = new gain level
output gain limited new gain adjustment
```

A zero crossing detector 252 receives the digital audio output signal 112. The zero crossing detector examines samples of the output signal 112 and generates a zero crossing output 244 upon detection of a zero crossing of the output signal 112. A zero crossing is defined as the product of two consecutive samples of the output signal 112 being less than or equal to zero.

A gain adjustment scheduler 234 receives the gain-limited new gain adjustment 248 and the zero crossing output 244. The gain adjustment scheduler 234 adjusts the amplifier gain to minimize the amount of distortion introduced by the system 100 into the output signal 112. The gain adjustment scheduler 234 advantageously accomplishes this purpose by adjusting the amplifier 104 gain near zero crossings and in incremental steps to avoid causing perceivable large distortion or clipping.

The gain adjustment scheduler 234 preferably calculates a number of gain adjustment steps by dividing the gain-limited new gain adjustment 248 by a gain step. Then, for each gain adjustment step the gain adjustment scheduler 234 preferably waits a gain adjustment interval and outputs the digital gain output 116 to adjust the amplifier 104 gain one gain step on the occurrence of a zero crossing. It is noted that the number of gain adjustment steps is a signed value since the gain-limited new gain adjustment 248 is also a signed value. The gain adjustment scheduler 234 maintains the old digital gain output which it uses to calculate the digital gain output 116. The following pseudo-code illustrates the operation of the gain adjustment scheduler 234.

```
gain adjustment steps =
gain limited new gain adjustment/gain step
while (gain adjustment steps ! = 0) {
if (gain adjustment steps > 0)
gain adjustment steps =
gain adjustment steps - 1
else if (gain adjustment steps < 0)
gain adjustment steps =
gain adjustment steps + 1
digital gain output =
old gain output * gain step
old gain output = digital gain output
wait one gain adjustment interval
wait for zero crossing
generate digital gain output
}
```

In the preferred embodiment of the present invention the gain step is approximately 1.5 dB and the gain adjustment interval is approximately 40 samples at a preferred sample rate of 8 kHz. By preferably waiting a gain adjustment interval to adjust the amplifier 104 gain, the gain adjustment scheduler 234 avoids adjusting the gain too frequently in the case where the output signal 112 frequency is high thus generating many zero crossings.

The voice activity detector 230 additionally generates a voice present output 238 upon detection of the presence of voice activity. The presence of voice activity is defined as the ratio of the short-term energy average output 242 and the long-term energy average output 210 being greater than a voice energy average threshold for a voice time threshold. The voice energy average threshold is preferably approximately 12 dB. The voice time threshold is preferably approximately 400 samples at a preferred sample rate of 8 kHz. The voice time threshold is preferably a relatively small value in order to avoid "cut-out" of the first portion, e.g., syllable, of a voice sequence.

The gain adjustment scheduler 234 receives the voice present output 238. The gain adjustment scheduler only increases the gain of the amplifier 104 in the presence of voice activity. Hence, the voice activity detector advantageously enables the system 100 to suppress noise amplification during periods of silence.

Numerous variations and modifications will become apparent to those skilled in the art once the above disclosure is fully appreciated. It is intended that the following claims be interpreted to embrace all such variations and modifications.

What is claimed is:

1. A system which performs automatic gain control on received audio data, comprising:

an amplifier with an adjustable gain which receives an audio input signal and a gain input and generates an audio output signal, wherein said amplifier selectively adjusts the gain of said audio output signal according to said gain input; and a gain control loop coupled to said amplifier which receives said amplified audio output signal and generates a gain output signal provided to said gain input of said amplifier to selectively adjust said gain of said amplifier, wherein said gain control loop further generates a gain adjustment signal, wherein said gain control loop comprises:

a zero-crossing detector which receives said audio output signal and generates a zero crossing output upon detection of a zero crossing, wherein said zero crossing occurs when a product of two consecutive samples of said audio output signal being less than or equal to zero;

a gain adjustment scheduler which receives said zero crossing output and said gain adjustment signal, wherein said gain adjustment scheduler maintains a previous gain output signal value, wherein said gain adjustment scheduler calculates a number of gain adjustment steps by dividing said gain adjustment signal by a gain step, wherein for each of said number of gain adjustment steps said gain adjustment scheduler waits a gain adjustment interval then generates said gain output signal when said zero crossing output indicates an occurrence of said zero crossing, wherein said gain output signal has a value which is one said gain step different than said previous gain output signal value.

2. The system of claim 1 further comprising:

a codec which converts said audio output signal from an analog signal to a digital signal; and wherein said control loop comprises a digital signal processor configured to analyze said audio output signal and provide said gain output signal to said amplifier to selectively adjust said amplifier gain.

3. The system of claim 1, wherein said control loop further comprises:

a voice activity detector which detects substantial voice activity, wherein said automatic gain control system amplifies said audio input signal only during said substantial voice activity.

4. The system of claim 1, wherein said amplifier has an associated gain range; and wherein said control loop further comprises:

a gain limiter which generates said gain adjustment signal according to said gain range, wherein said gain adjustment scheduler generates said gain output signal, wherein said amplifier adjusts said amplifier gain according to said gain output signal.

5. A system which performs automatic gain control on received audio data, comprising:

an amplifier with an adjustable gain which receives an audio input signal and a gain input and generates an audio output signal, wherein said amplifier selectively adjusts the gain of said audio output signal according to said gain input; and a gain control loop coupled to said amplifier which receives said amplified audio output signal and generates a gain output signal provided to said gain input of said amplifier to selectively adjust said gain of said amplifier, wherein said gain control loop comprises:

a long-term energy averager which receives said audio output signal and calculates a long-term energy average of said audio output signal based on a first number of samples of said audio output signal, wherein said long-term energy averager generates a long-term energy average output in response to said calculated long-term energy average;

a short-term energy averager which receives said audio output signal and calculates a short-term energy average of said audio output signal based on a second number of samples of said audio output signal, wherein said short-term energy averager generates a short-term energy average output in response to said calculated short-term energy average, wherein said second number is less than said first number; and a voice activity detector which receives said long-term energy average output and said short-term energy average output to detect substantial voice activity, wherein said automatic gain control system amplifies said audio input signal only during said substantial voice activity.

6. The system of claim 5, wherein said voice activity detector determines if the ratio of said short-term energy average output and said long-term energy average output is more than a voice energy average threshold for a voice time threshold, in order to detect said substantial voice activity.

7. The system of claim 5, wherein said control loop further comprises:

a rectifier which receives said audio output signal and rectifies said audio output signal, wherein said long-term energy averager receives said rectified audio output signal for calculating said long-term energy average, wherein said short-term energy averager receives said rectified audio output signal for calculating said short-term energy average.

8. A method for performing automatic gain control on a received audio input signal, comprising:

receiving a gain input signal;

amplifying said audio input signal to generate an audio output signal according to said gain input signal;

detecting a zero crossing of said audio output signal;

calculating a number of gain adjustment steps by dividing a gain adjustment signal by a gain step;

for each of said number of gain adjustment steps waiting a gain adjustment interval, generating a gain output: signal, and providing said gain output signal to said gain input signal.

9. The method of claim 8, further comprising:

converting said audio output signal from an analog signal to a digital signal.

10. The method of claim 8, further comprising:

detecting substantial voice activity on said audio output signal;

said amplifying said audio input signal only during detection of said substantial voice activity.

11. The method of claim 8 wherein said amplifying said audio input signal is within a limited gain range.

12. A method for performing automatic gain control on a received audio input signal, comprising:

receiving a gain input signal;

amplifying said audio input signal to generate an audio output signal according to said gain input signal;

calculating a long-term energy average of said audio output signal based on a first number of samples of said audio output signal;

calculating a short-term energy average of said audio output signal based on a second number of samples of said audio output signal;

detecting substantial voice activity on said audio output signal;

said amplifying said audio input signal only during detection of said substantial voice activity.

* * * * *

UNITED STATES PATENT AND TRADEMARK OFFICE
CERTIFICATE OF CORRECTION

PATENT NO. : 5,838,269
DATED : November 17, 1998
INVENTOR(S) : Zheng-Yi Xie

It is certified that error appears in the above-identified patent and that said Letters Patent is hereby corrected as shown below:

Claim 8, col. 10, line 37, please delete "output:" and substitute --output--.

Signed and Sealed this

Thirtieth Day of March, 1999

Attest:

Q. TODD DICKINSON

Attesting Officer

Acting Commissioner of Patents and Trademarks